United States Patent
Park et al.

(10) Patent No.: US 12,216,408 B2
(45) Date of Patent: Feb. 4, 2025

(54) APPARATUS FOR DRYING WAFER AND METHOD FOR DRYING WAFER

(71) Applicant: SAMSUNG ELECTRONICS CO., LTD., Suwon-si (KR)

(72) Inventors: Sangjine Park, Suwon-si (KR); Jihoon Jeong, Seongnam-si (KR); Younghoo Kim, Yongin-si (KR); Kuntack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 480 days.

(21) Appl. No.: 17/673,978

(22) Filed: Feb. 17, 2022

(65) Prior Publication Data

US 2023/0004089 A1 Jan. 5, 2023

(30) Foreign Application Priority Data

Jul. 2, 2021 (KR) .................. 10-2021-0087145

(51) Int. Cl.
 *G03F 7/16* (2006.01)
(52) U.S. Cl.
 CPC .................................. *G03F 7/168* (2013.01)
(58) Field of Classification Search
 None
 See application file for complete search history.

(56) References Cited

U.S. PATENT DOCUMENTS

| | | |
|---|---|---|
| 6,848,458 B1 | 2/2005 | Shrinivasan et al. |
| 8,197,603 B2 | 6/2012 | Jackson |
| 10,074,546 B2 | 9/2018 | Terashita et al. |
| 10,347,511 B2 | 7/2019 | Verhaverbeke et al. |
| 10,777,405 B2 | 9/2020 | Gouk et al. |
| 2006/0254612 A1 | 11/2006 | Farrar |
| 2015/0155158 A1 | 6/2015 | Kim et al. |

FOREIGN PATENT DOCUMENTS

| | | | |
|---|---|---|---|
| KR | 10-2015-0062908 A | | 6/2015 |
| KR | 20210010057 A | * | 1/2021 |

* cited by examiner

*Primary Examiner* — Eric W Golightly
(74) *Attorney, Agent, or Firm* — Sughrue Mion, PLLC

(57) ABSTRACT

An apparatus for drying a wafer, includes: a drying chamber; a supercritical fluid supply module configured to supply supercritical fluid to the drying chamber; a main exhaust line connected to the drying chamber and in which a main valve is installed; and an auxiliary exhaust unit connected to the main exhaust line. The auxiliary exhaust unit includes: an auxiliary exhaust line connected to the main exhaust line and configured to exhaust the supercritical fluid from the drying chamber when the main valve is closed; a negative pressure tank installed in the auxiliary exhaust line; a first valve, installed in the auxiliary exhaust line, that is configured to be opened when the main valve is closed; and a second valve, installed in the auxiliary exhaust line, that is configured to be opened in conjunction with the first valve.

11 Claims, 12 Drawing Sheets

APPARATUS FOR DRYING WAFER AND METHOD FOR DRYING WAFER

CROSS-REFERENCE TO THE RELATED APPLICATION

This application claims benefit of priority to Korean Patent Application No. 10-2021-0087145 filed on Jul. 2, 2021 in the Korean Intellectual Property Office, the disclosure of which is incorporated by reference herein in its entirety.

BACKGROUND

Embodiments of the present disclosure relate to an apparatus for drying a wafer and a method for drying the wafer.

Use of an extreme ultraviolet (EUV) photo-lithography process for implementing finer patterns is gradually becoming more prominent, and there is a problem in that it may be difficult to prevent the pattern from collapsing, such as in the case of the existing method, wherein in the existing method, a developer is coated on a substrate during a photo-resist (PR) development process and rotated at a high speed and dried as a critical dimension (CD) of an exposed photo-resist is gradually decreasing.

This is because pulling force between patterns acts during drying under the influence of surface tension of the developer. This problem can be solved if the developer is replaced with supercritical fluid with little surface tension and then dried.

SUMMARY

An embodiment of the present disclosure includes an apparatus for drying a wafer and a method for drying a wafer capable of shortening an exhaust time of supercritical fluid.

In addition, an embodiment of the present disclosure includes an apparatus for drying a wafer and a method for drying a wafer capable of preventing contamination of a wafer and a drying chamber by impurities.

According to one or more embodiments, an apparatus for drying a wafer is provided. The apparatus includes: a drying chamber having an interior space; a supercritical fluid supply module connected to the drying chamber and configured to supply supercritical fluid to the drying chamber; a main exhaust line connected to the drying chamber and in which a main valve is installed; and an auxiliary exhaust unit connected to the main exhaust line. The supercritical fluid supply module includes: a fluid storage tank; a condenser connected to the fluid storage tank and configured to pressurize fluid; a pump disposed at a rear end of the condenser; a reservoir tank disposed at a rear end of the pump and configured to store the fluid pressurized by the condenser; and a heater disposed at a rear end of the reservoir tank and configured to heat the fluid. The auxiliary exhaust unit includes: an auxiliary exhaust line connected to the main exhaust line and configured to exhaust the supercritical fluid from the drying chamber when the main valve is closed; a negative pressure tank installed in the auxiliary exhaust line; a first valve, installed in the auxiliary exhaust line, that is disposed at a front end of the negative pressure tank and configured to be opened when the main valve is closed; and a second valve, installed in the auxiliary exhaust line, that is disposed at a rear end of the negative pressure tank and configured to be opened in conjunction with the first valve, wherein a ratio of a pressure reduction amount in the drying chamber to an exhaust time of the supercritical fluid through the auxiliary exhaust unit, when internal pressure of the drying chamber is equal to or lower than a first pressure, has an absolute value within a range of 0.75 to 9.0 bar/sec.

According to one or more embodiments, method for drying a wafer is provided. The method includes: supplying supercritical fluid to a drying chamber; stopping a supply of the supercritical fluid and drying a developer in the drying chamber; and exhausting the supercritical fluid from the drying chamber, wherein the exhausting the supercritical fluid includes: exhausting the supercritical fluid through a main exhaust line connected to the drying chamber by opening a main valve, based on pressure of the drying chamber being above a first pressure, based on the pressure of the drying chamber decreasing to the first pressure, exhausting the supercritical fluid through a negative pressure tank installed in an auxiliary exhaust line by closing the main valve and opening a first valve and a second valve that are installed in the auxiliary exhaust line, wherein a ratio of a pressure reduction amount in the drying chamber to an exhaust time of the supercritical fluid has an absolute value in a range of 0.75 to 9.0 bar/sec, in a case where the supercritical fluid is exhausted through the negative pressure tank installed in the auxiliary exhaust line.

BRIEF DESCRIPTION OF DRAWINGS

The above and other aspects, features, and advantages of embodiments of the present disclosure will be more clearly understood from the following detailed description, taken in conjunction with the accompanying drawings, in which.

DETAILED DESCRIPTION

Hereinafter, non-limiting example embodiments of the present disclosure will be described with reference to the accompanying drawings.

Figure 1:
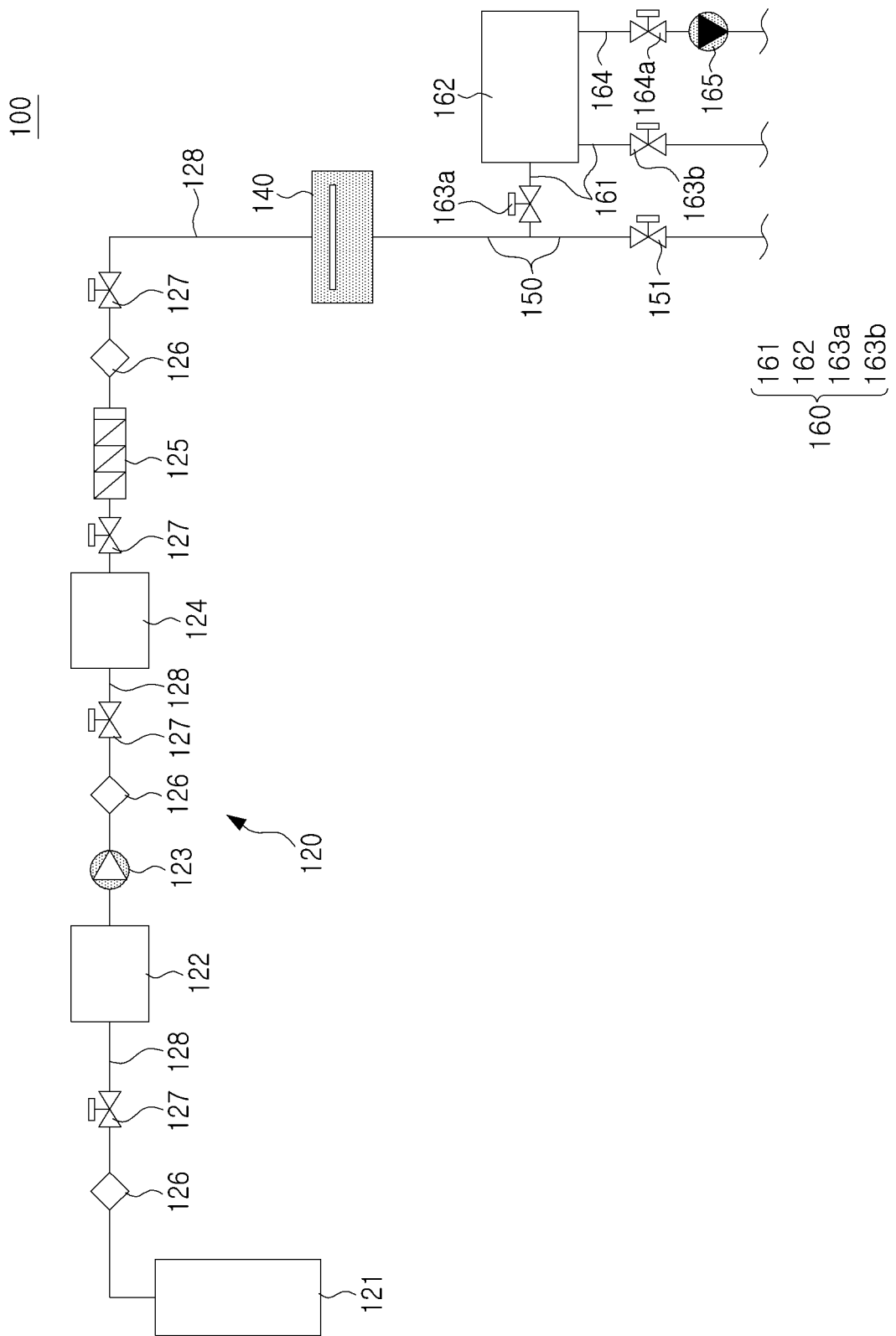
FIG. 1 is schematic configuration diagram illustrating an apparatus for drying a wafer according to an example embodiment.

FIG. 1 is schematic configuration diagram illustrating an apparatus for drying a wafer according to an example embodiment.

Referring to FIG. 1, an apparatus 100 for drying a wafer includes, as an example, a supercritical fluid supply module 120, a drying chamber 140, a main exhaust line 150, and an auxiliary exhaust unit 160.

The supercritical fluid supply module 120 is connected to the drying chamber 140, and supplies supercritical fluid to the drying chamber 140. The supercritical fluid supply module 120 may include, as an example, a fluid storage tank 121, a condenser 122, a pump 123, a reservoir tank 124, a heater 125, a filter 126, a valve 127, and a supply line 128.

The fluid storage tank 121 has an internal space and stores fluid in a low temperature state therein. As an example, the fluid stored in the fluid storage tank 121 may be low-temperature $CO_2$. The low-temperature $CO_2$ may be approximately $CO_2$ of 35° C. or higher and 70° C. or lower.

The condenser 122 is connected to the fluid storage tank 121 to pressurize low-temperature $CO_2$, which is a supplied fluid. That is, the condenser 122 is connected to the fluid storage tank 121 through the supply line 128, and pressurizes the low-temperature $CO_2$ supplied from the fluid storage tank 121.

The pump 123 is disposed at a rear end of the condenser 122, and is connected to the condenser 122 through the supply line 128. The pump 123 serves to provide driving force for supplying fluid to the drying chamber 140. In addition, the pump 123 may serve to pressurize the fluid supplied into the drying chamber 140 to convert the same into supercritical fluid.

The reservoir tank 124 is disposed at a rear end of the pump 123 and is connected to the pump 123 through a supply line 128. After fluid that has passed through the condenser 122 is mixed, the reservoir tank 124 serves to supply the fluid to the drying chamber 140. To this end, the reservoir tank 124 may have an internal space in which the fluid passing through the condenser 122 can be sufficiently mixed.

The heater 125 is connected to the reservoir tank 124 through the supply line 128, and serves to heat fluid supplied from the reservoir tank 124. Accordingly, the fluid heated through the heater 125 may be supplied to the drying chamber 140 through the supply line 128. As an example, the fluid heated by the heater 125 may be high-temperature $CO_2$. Here, the high-temperature $CO_2$ may be between 70° C. and 1200° C.

A plurality of filters 126 may be installed in the supply line 128. The filter 126 serves to remove foreign substances from the fluid supplied to the drying chamber 140, so that pure fluid from which the foreign substances are removed is supplied to the drying chamber 140. As an example, the filter 126 may be installed in the supply line 128 to be disposed at a rear end of the fluid storage tank 121, the pump 123, and the heater 125.

A valve 127 is installed in the supply line 128 and may be provided in plural. As an example, the valve 127 may be disposed between the fluid storage tank 121 and the condenser 122, between the pump 123 and the reservoir tank 124, between the reservoir tank 124 and the heater 125, and between the heater 125 and the drying chamber 140, respectively. However, embodiments of the present disclosure are not limited thereto, and one or more of the valves 127 may be added or omitted.

As described above, the low temperature $CO_2$ supplied from the fluid storage tank 121 passes through the condenser 122, the reservoir tank 124, and the heater 125, a state of the $CO_2$ is changed to high-temperature and high-pressure $CO_2$, and the $CO_2$ may be supplied to the drying chamber 140.

The drying chamber 140 has an interior space and dries a wafer on which a developer remains due to the supercritical fluid. In addition, the drying chamber 140 may be provided with a fixed installation table (not shown) on which the developed wafer is mounted. When the wafer is dried, the drying chamber 140 is sealed from the outside. Meanwhile, the supercritical fluid is sufficiently mixed with the developer and then discharged from the drying chamber 140 through a main exhaust line 150.

Meanwhile, supercritical fluid refers to a state of matter existing at a temperature and pressure above a critical point at which liquid and gas are separated. As an example, the supercritical fluid may be supercritical $CO_2$. Pressure of the supercritical $CO_2$ may be 73 bar or more, and the temperature of the supercritical $CO_2$ may be 33.1° C. or more.

The main exhaust line 150 is connected to the drying chamber 140 to exhaust supercritical fluid mixed with the developer (hereinafter, the supercritical fluid mixed with the developer is referred to as supercritical fluid) externally. As an example, a main valve 151 may be installed in the main exhaust line 150, and exhaustion through the main exhaust line 150 or an auxiliary exhaust line 161 to be described later may be performed through opening and closing of the main valve 151. Meanwhile, the supercritical fluid exhausted from the drying chamber 140 may be exhausted through the main exhaust line 150 down to a first pressure, and pressure of the drying chamber 140 at this time may be in a high pressure state of 80 bar or more. Meanwhile, the first pressure may have a value within a range of 20 bar to 80 bar, for example.

The auxiliary exhaust unit 160 increases exhaust velocity of the supercritical fluid exhausted from the drying chamber 140. As an example, the auxiliary exhaust unit 160 includes an auxiliary exhaust line 161, a negative pressure tank 162, a first valve 163a, a second valve 163b, a pipe 164 for forming negative pressure, and a pump 165 for forming negative pressure.

The auxiliary exhaust line 161 is connected to the main exhaust line 150. The auxiliary exhaust line 161 provides a flow path for exhausting the supercritical fluid at a pressure equal to or lower than the first pressure when the pressure of the drying chamber 140 is equal to or lower than the first pressure.

The negative pressure tank 162 is installed in the auxiliary exhaust line 161, and communicates with the drying chamber 140 when the pressure of the drying chamber 140 is equal to or lower than the first pressure. Accordingly, a difference in pressure between the drying chamber 140 and the negative pressure tank 162 is greater than a difference in pressure between the drying chamber 140 and atmospheric pressure. Accordingly, even when the pressure of the drying chamber 140 is lower than the first pressure, an exhaust velocity of the supercritical fluid from the drying chamber 140 may be greater. Meanwhile, the negative pressure tank 162 may maintain a closed state by opening the main valve 151 and closing the first valve 163a and the second valve 163b when the pressure of the drying chamber 140 is greater than the first pressure. Thereafter, when the pressure of the drying chamber 140 is equal to or lower than the first pressure, the main valve 151 is closed and the first valve 163a and the second valve 163b are opened, and the negative pressure tank 162 and the drying chamber 140 communicate with each other. Accordingly, supercritical fluid is exhausted through the auxiliary exhaust line 161.

The first valve 163a is installed in the auxiliary exhaust line 161 to be disposed at a front end of the negative pressure tank 162, and the second valve 163b is installed in the auxiliary exhaust line 161 to be disposed at a rear end of the negative pressure tank 162.

For example, when the pressure of the drying chamber 140 is greater than the first pressure, the main valve 151 installed in the main exhaust line 150 is opened so that the supercritical fluid is exhausted only through the main exhaust line 150. Thereafter, when the pressure of the drying chamber 140 is equal to or lower than the first pressure, the main valve 151 installed in the main exhaust line 150 is closed, and the first valve 163a and the second valve 163b installed in the auxiliary exhaust line 161 are opened so that the supercritical fluid is exhausted only through the auxiliary exhaust line 161.

Meanwhile, when the pressure of the drying chamber 140 is equal to or lower than a second pressure, the main valve 151 installed in the main exhaust line 150 is opened and the first valve 163a and the second valve 163b installed in the auxiliary exhaust line 161 are closed to prevent the pressure of the drying chamber 140 from being in a negative pressure state. Accordingly, exhausting from the drying chamber 140 is made only through the main exhaust line 150. In this case, exhaustion from the drying chamber 140 is performed by a difference in pressure between the drying chamber 140 and atmospheric pressure. Meanwhile, the second pressure may be higher than approximately atmospheric pressure and may have a value of 2 bar or less. Hereinafter, the exhaustion performed by the pressure difference between the pressure of the drying chamber 140 and the atmospheric pressure is referred to as natural exhaust. Meanwhile, negative pressure means pressure lower than atmospheric pressure.

The pipe 164 for forming the negative pressure is connected to the negative pressure tank 162. For example, when the exhausting of the supercritical fluid is completed through the negative pressure tank 162, the pipe 164 connected to the negative pressure tank 162 serves to form pressure of the negative pressure tank 162 as negative pressure. Meanwhile, an opening/closing valve 164a for opening and closing the pipe 164 may be installed in the pipe 164.

A pump 165 for forming negative pressure serves to exhaust fluid stored in the negative pressure tank 162 to form the pressure of the negative pressure tank 162 as negative pressure. Meanwhile, the pump 165 is driven, the opening/closing valve 164a is opened, and the plurality of valves (e.g. the first valve 163a and the second valve 163b) are all closed.

As described above, when the pressure of the drying chamber 140 through the auxiliary exhaust unit 160 is equal to or lower than a first pressure, an exhaust time of the supercritical fluid exhausted from the drying chamber 140 may be reduced. Thereby, contamination by foreign substances can be reduced.

Figure 2:
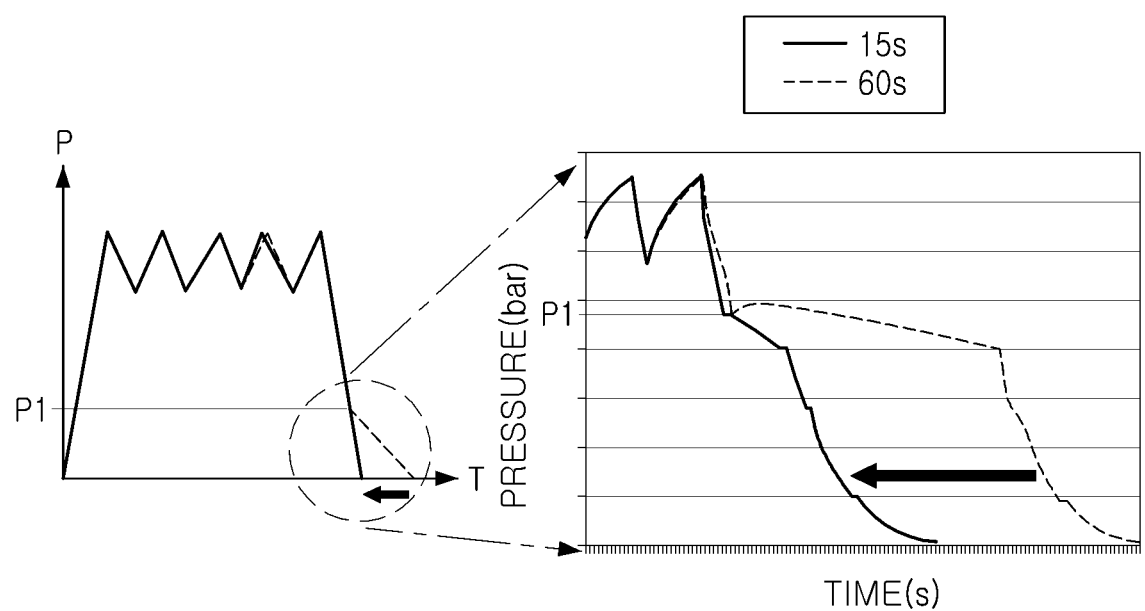
FIG. 2 is a graph for illustrating an exhaust time of an apparatus for drying a wafer according to an example embodiment.

Looking at this in more detail, as shown in FIG. 2, when the supercritical fluid is continuously exhausted through the main exhaust line 150 when the pressure of the drying chamber 140 is equal to or lower than a first pressure P1, it can be seen that the exhaust time takes approximately 60 s. However, when the supercritical fluid is exhausted through the auxiliary exhaust line 161 of the auxiliary exhaust unit 160, it can be seen that the exhaust time takes approximately 15 s. In other words, it can be seen that the exhaust time is reduced when the supercritical fluid is exhausted from the drying chamber 140 by using the pressure difference between the pressure of the negative pressure tank 162 of the auxiliary exhaust unit 160 and the pressure of the drying chamber 140.

That is, as shown in FIG. 2, it can be seen that a ratio (slope) of a pressure reduction amount of the drying chamber 140 to the exhaust time of the supercritical fluid, when the supercritical fluid is continuously exhausted through the main exhaust line 150 when the pressure of the drying chamber 140 is equal to or lower than a first pressure P1, has an absolute value that is smaller than an absolute value of a ratio (slope) of a pressure reduction amount of the drying chamber 140 to the exhaust time of the supercritical fluid when the supercritical fluid is exhausted through the auxiliary exhaust line 161 when the pressure of the drying chamber 140 is equal to or lower than the first pressure P1.

However, when the pressure of the drying chamber 140 is equal to or lower than the first pressure P1, the ratio (slope) of the pressure reduction amount of the drying chamber 140 to the exhaust time of the supercritical fluid is not limited to the example embodiment of FIG. 2.

For example, when the first pressure P1 is 80 bar, a section in which the pressure of the drying chamber 140 is 80 bar to 20 bar is referred to as a first section, and a section in which the pressure of the drying chamber 140 is 20 bar or less is referred to as a second section, a ratio (slope) of the pressure reduction amount of the drying chamber 140 to the exhaust time of the supercritical fluid in the first section may have an absolute value within a range of 0.75 to 9.0 bar/sec, and a ratio (slope) of the pressure reduction amount of the drying chamber 140 to the exhaust time of the supercritical fluid in the second section may have an absolute value within a range of 0.95 to 2 bar/sec. Accordingly, the ratio (slope) of the pressure reduction amount of the drying chamber 140 to the exhaust time of the supercritical fluid at the first pressure P1 or less may have an absolute value within a range of 0.75 to 9.0 bar/sec.

In addition, when the pressure of the drying chamber 140 is equal to or lower than the first pressure P1, the exhaust time of the supercritical fluid may have a value within a range of 10 s to 50 s.

Figure 3:
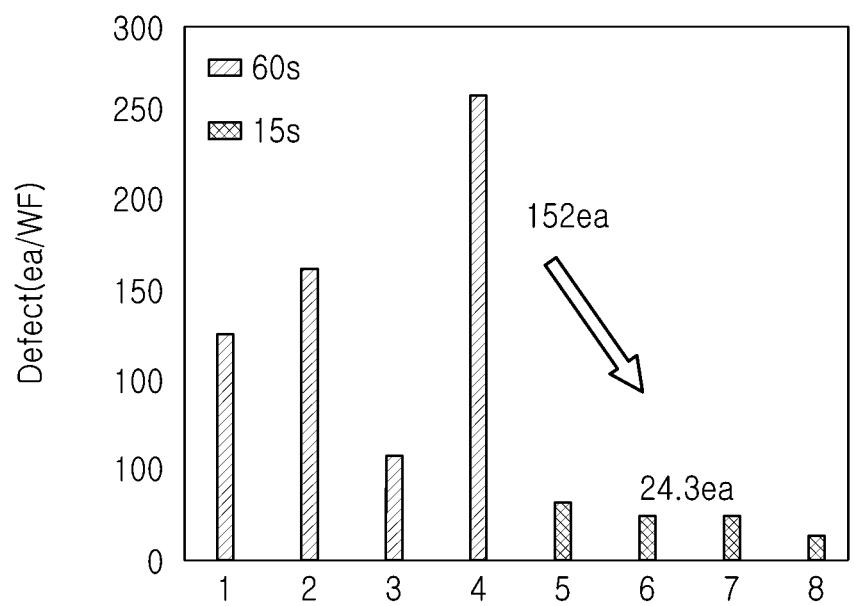
FIG. 3 is a graph for illustrating an effect of an apparatus for drying a wafer according to an example embodiment.

As shown in FIG. 3, when the exhaust time is 15 s, it can be seen that the occurrence of defects due to re-adsorption of foreign substances is reduced by approximately 84% compared to the case in which the exhaust time is 60 s. With reference to FIG. 3, "ea/WF" refers to the number of defects per wafer.

As described above, when the pressure of the drying chamber 140 through the auxiliary exhaust unit 160 is equal to or lower than the first pressure, the exhaust time of the supercritical fluid exhausted from the drying chamber 140 may be reduced. Accordingly, it can be seen that contamination by foreign stances may be reduced.

Furthermore, when the pressure of the drying chamber 140 is equal to or lower than the second pressure, exhausting may be performed through natural exhaustion to prevent negative pressure from being generated in the drying chamber 140. Accordingly, the supercritical fluid mixed with the exhausted developer is prevented from being introduced back into the drying chamber 140 in order to prevent the drying chamber 140 or a wafer from being contaminated.

Figure 4:
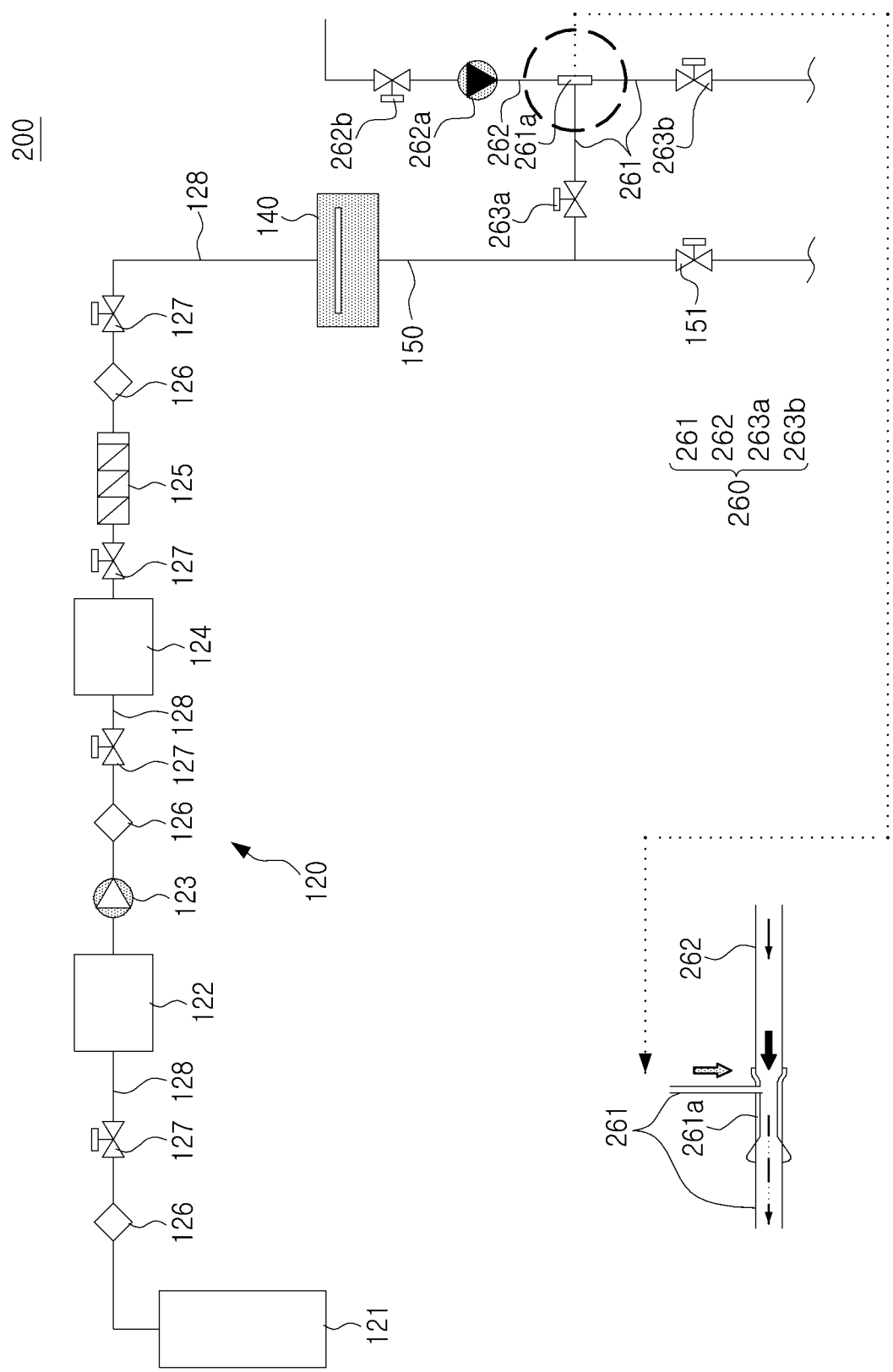
FIG. 4 is a schematic configuration diagram illustrating an apparatus for drying a wafer according to an example embodiment.

FIG. 4 is a schematic configuration diagram illustrating an apparatus for drying a wafer according to an example embodiment.

Referring to FIG. 4, an apparatus 200 for drying a wafer includes, as an example, a supercritical fluid supply module 120, a drying chamber 140, a main exhaust line 150, and an auxiliary exhaust unit 260.

Meanwhile, since the supercritical fluid supply module 120, the drying chamber 140, and the main exhaust line 150 are substantially the same as the components described in the above example embodiment, a detailed description thereof will be omitted below and may be understood based on the above description.

The auxiliary exhaust unit 260 is connected to the main exhaust line 150, and serves to increase exhaust velocity of the supercritical fluid exhausted from the drying chamber 140. To this end, the auxiliary exhaust unit 260 may include an auxiliary exhaust line 261 (e.g. a pipe), an external air supply line 262 (e.g. a pipe), and a plurality of valves (e.g. a first valve 263a and a second valve 263b).

The auxiliary exhaust line 261 is connected to the main exhaust line 150. Meanwhile, the auxiliary exhaust line 261 provides a flow path for exhausting supercritical fluid at pressure equal to or lower than a first pressure when the pressure of the drying chamber 140 is equal to or lower than the first pressure. As an example, the auxiliary exhaust line 261 has an orifice portion 261a. The orifice portion 261a is a configuration for generating negative pressure, and as external air supplied through an external air supply line 262 passes through the orifice portion 261a, negative pressure is formed in the orifice portion 261a. Accordingly, the exhaust velocity of the supercritical fluid flowing along the auxiliary exhaust line 161 may be increased.

The external air supply line 262 is connected to the orifice portion 261a of the auxiliary exhaust line 261 to supply external air so that the external air passes through the orifice portion 261a. To this end, a supply pump 262a may be installed in the external air supply line 262. As described above, the external air is supplied to pass through the orifice portion 261a of the auxiliary exhaust line 261 through the external air supply line 262 to form negative pressure of the orifice portion 261a. Accordingly, when the pressure of the drying chamber 140 is equal to or lower than a first pressure, the pressure difference between the pressure of the drying chamber 140 and the orifice portion 261a becomes greater than the pressure difference between the pressure of the drying chamber 140 and the atmospheric pressure.

Meanwhile, an opening/closing valve 262b disposed at a rear end of the supply pump 262a may be installed in the external air supply line 262. The opening/closing valve 262b may be opened only when external air is supplied to the orifice portion 261a through the external air supply line 262.

The first valve 263a and the second valve 263b may be installed to be disposed at front and rear ends of the orifice portion 261a.

For example, when the pressure of the drying chamber 140 is greater than a first pressure, the main valve 151 installed in the main exhaust line 150 is opened so that the supercritical fluid is exhausted only through the main exhaust line 150. Thereafter, when the pressure of the drying chamber 140 is equal to or lower than the first pressure, the main valve 151 installed in the main exhaust line 150 is closed, and the first valve 263a and the second valve 263b installed in the auxiliary exhaust line 261 is opened so that the supercritical fluid is exhausted only through the auxiliary exhaust line 261.

When the pressure of the drying chamber 140 is equal to or lower than a second pressure, the main valve 151 installed in the main exhaust line 150 is opened and the first valve 263a and the second valve 263b installed in the auxiliary exhaust line 261 are closed, to prevent the pressure of the drying chamber 140 from being in a negative pressure state. Accordingly, exhausting from the drying chamber 140 is performed only through the main exhaust line 150. In this case, the exhaustion from the drying chamber 140 is performed by a pressure difference between the pressure of the drying chamber 140 and atmospheric pressure.

As described above, when the pressure of the drying chamber 140 through the auxiliary exhaust unit 260 is equal to or lower than the first pressure, an exhaust time of the supercritical fluid exhausted from the drying chamber 140 may be reduced. Thereby, contamination by foreign substances can be reduced.

Furthermore, when the pressure of the drying chamber 140 is equal to or lower than a second pressure, it is possible to prevent negative pressure from being generated in the drying chamber 140 by performing exhaustion through natural exhaust. Accordingly, it is possible to prevent the drying chamber 140 or a wafer from being contaminated by the supercritical fluid mixed with the exhausted developer flowing back into the drying chamber 140.

Figure 5:
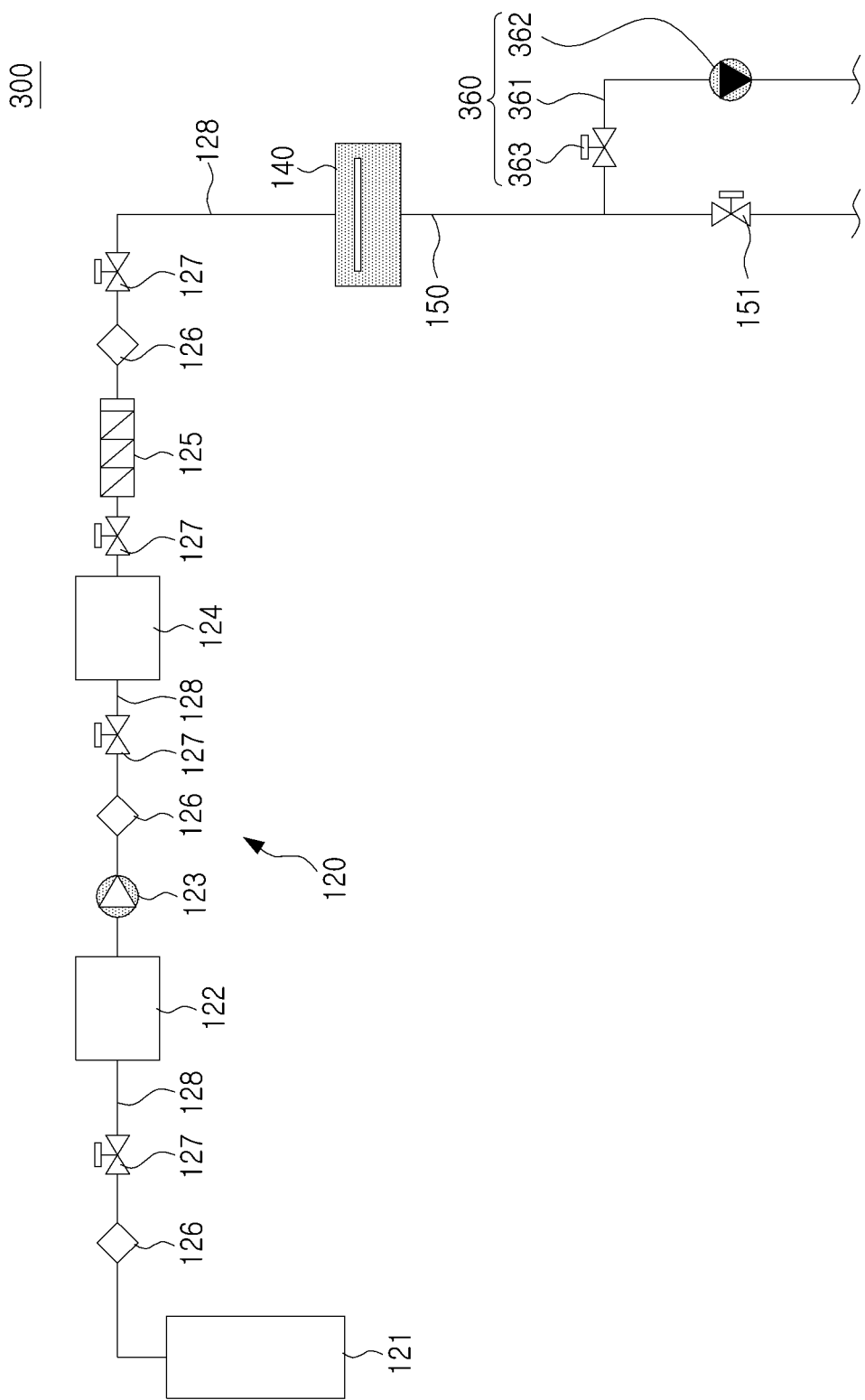
FIG. 5 is a schematic configuration diagram illustrating an apparatus for drying a wafer according to an example embodiment.

FIG. 5 is a schematic configuration diagram illustrating an apparatus for drying a wafer according to an example embodiment.

Referring to FIG. 5, an apparatus 300 for drying a wafer includes, as an example, a supercritical fluid supply module 120, a drying chamber 140, a main exhaust line 150, and an auxiliary exhaust unit 360.

Meanwhile, since the supercritical fluid supply module 120 and the drying chamber 140 and the main exhaust line 150 are substantially the same as the components described in the above-described example embodiments, a detailed description thereof will be omitted below and may be understood based on the above description.

The auxiliary exhaust unit 360 is connected to the main exhaust line 150, and serves to increase exhaust velocity of the supercritical fluid exhausted from the drying chamber 140. To this end, the auxiliary exhaust unit 360 may include an auxiliary exhaust line 361, an auxiliary exhaust pump 362, and a valve 363.

The auxiliary exhaust line 361 is connected to the main exhaust line 150. Meanwhile, the auxiliary exhaust line 361 provides a flow path for exhausting the supercritical fluid when the pressure of the drying chamber 140 is equal to or lower than a first pressure.

Figure 6:
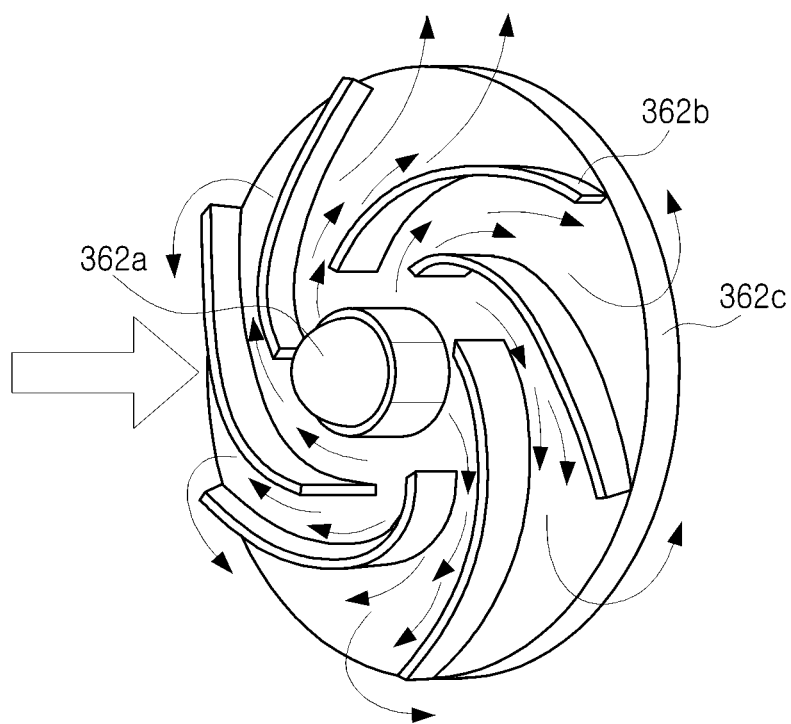
FIG. 6 is a perspective view illustrating an impeller of an auxiliary exhaust pump according to an example embodiment.

An auxiliary exhaust pump 362 is installed in the auxiliary exhaust line 361. Meanwhile, the auxiliary exhaust pump 362 operates when supercritical fluid flows into the auxiliary exhaust line 361 by the valve 363 when the pressure of the drying chamber 140 is equal to or lower than a first pressure. As described above, since the supercritical fluid is exhausted from the drying chamber 140 by the auxiliary exhaust pump 362, since the pressure of the drying chamber 140 is equal to or lower than the first pressure, the exhausting time of the supercritical fluid is reduced, compared to the case in which the supercritical fluid is exhausted by the difference in pressure from atmospheric pressure. Meanwhile, as shown in FIG. 6, the auxiliary exhaust pump 362 includes a driving shaft 362a in a central portion thereof, and an impeller 362c having a wing portion 362b having a helical structure around the driving shaft 362a, and the supercritical fluid flowing along the auxiliary exhaust line 361 flows into the central portion of the impeller 362c on which the driving shaft 362a is disposed, and then flows along the wing portion 362b to an outside of the impeller 362c. Accordingly, even when supercritical fluid having high density flows into the auxiliary exhaust pump 362, it is possible to reduce damages to the auxiliary exhaust pump 362 by the supercritical fluid. In other words, since the introduced supercritical fluid collides with the driving shaft 362a, the driving shaft 362a having relatively large rigidity may not be damaged, so it is possible to reduce the damage of the auxiliary exhaust pump 362 by the supercritical fluid.

The valve 363 allows the supercritical fluid to flow into the auxiliary exhaust line 361. To this end, a main valve 151 is installed in the main exhaust line 150, and a valve 363 may be installed in the auxiliary exhaust line 361 to be disposed at a front end of the auxiliary exhaust pump 362.

For example, when the pressure of the drying chamber 140 is greater than a first pressure, the main valve 151 installed in the main exhaust line 150 is opened so that the supercritical fluid is exhausted only through the main exhaust line 150. Thereafter, when the pressure of the drying chamber 140 is equal to or lower than the first pressure, the main valve 151 installed in the main exhaust line 150 is closed and the valve 363 installed in the auxiliary exhaust line 361 is opened, such that the supercritical fluid is exhausted only through the auxiliary exhaust line 161.

Meanwhile, when the pressure of the drying chamber 140 is equal to or lower than a second pressure, the main valve 151 installed in the main exhaust line 150 is opened and the valve 363 installed in the auxiliary exhaust line 361 is closed to prevent the pressure of the drying chamber 140 from being in a negative pressure state. Accordingly, exhausting from the drying chamber 140 is performed only through the main exhaust line 150. In this case, the exhaust from the drying chamber 140 is performed by a pressure difference between the pressure of the drying chamber 140 and atmospheric pressure.

As described above, when the pressure of the drying chamber 140 through the auxiliary exhaust unit 360 is equal to or lower than a first pressure, the exhaust time of the supercritical fluid exhausted from the drying chamber 140 may be reduced. Thereby, contamination by foreign substances can be reduced.

In addition, it is possible to reduce damage to the auxiliary exhaust pump 362 due to a flow of the supercritical fluid through the impeller 362c provided in the auxiliary exhaust pump 362.

Furthermore, when the pressure of the drying chamber 140 is equal to or lower than a second pressure, it is possible to prevent negative pressure from being generated in the drying chamber 140 by performing exhaustion through natural exhaust. Accordingly, it is possible to prevent the drying chamber 140 or a wafer from being contaminated by the supercritical fluid mixed with the exhausted developer flowing back into the drying chamber 140.

Figure 7:
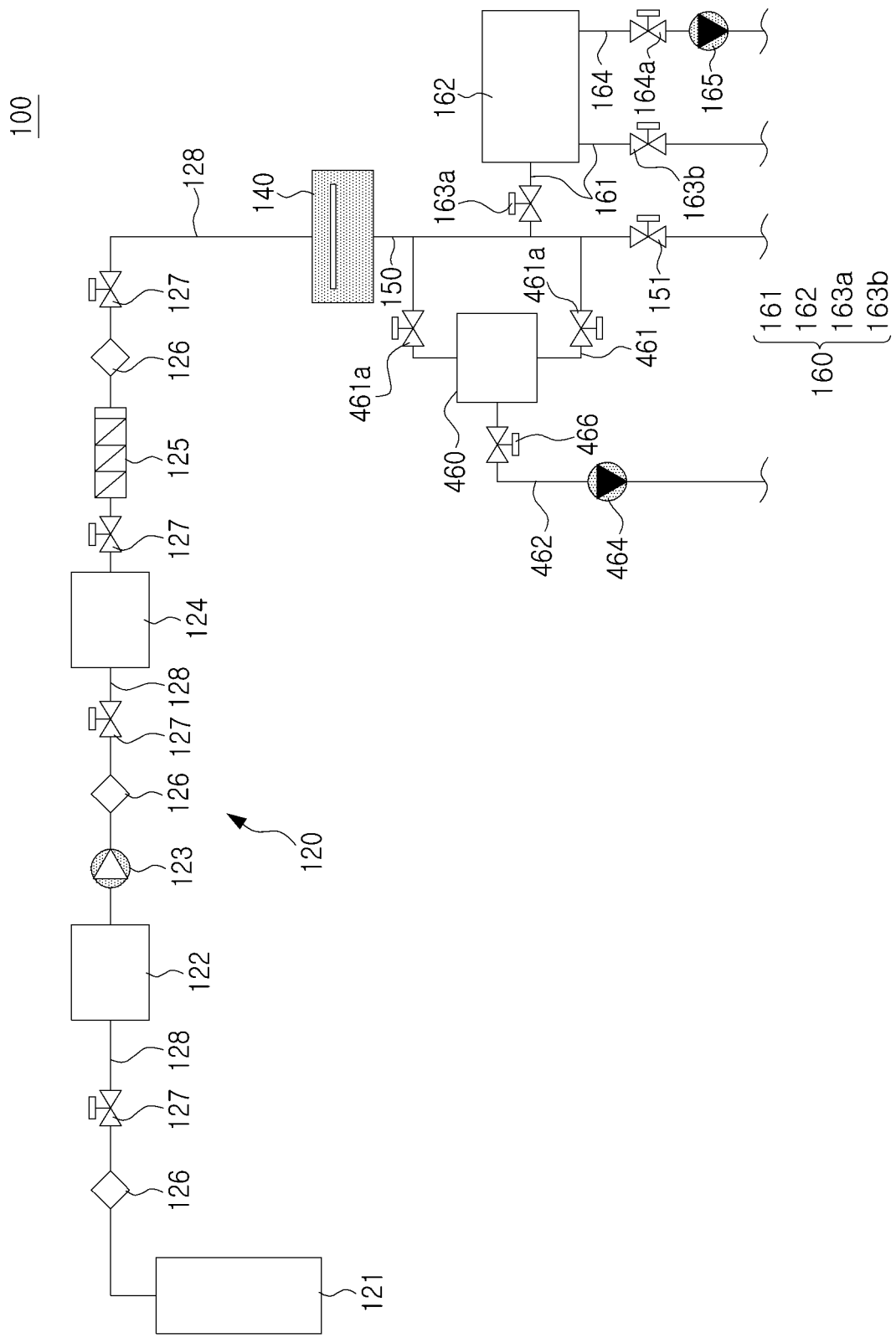
FIG. 7 is a schematic configuration diagram illustrating an apparatus for drying a wafer according to an example embodiment.

FIG. 7 is a schematic configuration diagram illustrating an apparatus for drying a wafer according to an example embodiment.

Referring to FIG. 7, an apparatus 400 for drying a wafer, as an example, includes a supercritical fluid supply module 120, a drying chamber 140, a main exhaust line 150, a main negative pressure tank 460, and an auxiliary exhaust unit 160.

Meanwhile, since the supercritical fluid supply module 120 and the drying chamber 140, and the main exhaust line 150 are substantially the same as the components described in the above-described example embodiments, a detailed description thereof will be omitted below and may be understood based on the above description. In addition, since the configuration of the auxiliary exhaust unit 160 except for the main negative pressure tank 460 is substantially the same as the components described in the above-described example embodiments, a detailed description thereof will be omitted below and may be understood based on the above description.

The apparatus 400 for drying a wafer further includes a main negative pressure tank 460, and the main negative pressure tank 460 is installed in a bypass pipe 461 connected to the main exhaust line 150. In addition, the main negative pressure tank 460 may have an interior space having a volume larger than that of the interior space of the drying chamber 140 for smooth exhaust of the supercritical fluid. As an example, the main negative pressure tank 460 is connected to the main exhaust line 150 to shorten an exhaust time of the supercritical fluid when the pressure of the drying chamber 140 is equal to or lower than a third pressure, that is greater than the first pressure. Accordingly, when the pressure of the drying chamber 140 is greater than the first pressure and equal to or lower than the third pressure, the supercritical fluid exhausted from the drying chamber 140 is exhausted externally through the main negative pressure tank 460. Thereafter, when the pressure of the drying chamber 140 is equal to or lower than the first pressure, the supercritical fluid is exhausted by the auxiliary exhaust line 161.

Meanwhile, the third pressure may have a value within a range of approximately 80 bar to 100 bar.

In addition, a plurality of bypass valves 461a for controlling a flow of the supercritical fluid through a bypass pipe 461 may be installed in the bypass pipe 461.

Here, looking briefly at the exhaust method from the drying chamber 140, first, when exhaust from the drying chamber is started, the supercritical fluid is exhausted through the main exhaust line 150, and is naturally exhausted. Thereafter, when the pressure of the drying chamber 140 becomes equal to or lower than the third pressure, the supercritical fluid is exhausted through the main negative pressure tank 460. Thereafter, when the pressure of the drying chamber 140 becomes equal to or lower than the first pressure, the supercritical fluid is exhausted through the auxiliary exhaust line 161.

As described above, since the main negative pressure tank 460 is installed in the main exhaust line 150, the exhaust time of the supercritical fluid until the pressure of the drying chamber 140 decreases to the first pressure from the third pressure can also be reduced. Accordingly, the possibility of contamination due to re-adsorption of foreign substances can be further reduced.

Meanwhile, the main negative pressure tank 460 may include a main pipe 462 for forming negative pressure and a main pump 464 for forming negative pressure installed in the pipe 462. For example, when the pressure of the main negative pressure tank 460 becomes negative pressure, the main pump 464 for negative pressure formation is driven to discharge fluid discharged from the main negative pressure tank 460 through the main pipe 462 to ambient air. In addition, an opening/closing valve 466 may be installed in the main pipe 462.

As described above, the supercritical fluid is exhausted through the main negative pressure tank 460 before the pressure of the drying chamber 140 becomes equal to or lower than the first pressure, and when the pressure of the drying chamber 140 is equal to or lower than the first pressure, the supercritical fluid may be exhausted through the negative pressure tank 162 of the auxiliary exhaust unit 160 such that an exhaust time of the supercritical fluid may be further reduced. Accordingly, it is possible to further reduce contamination due to re-adsorption of foreign substances.

Figure 8:
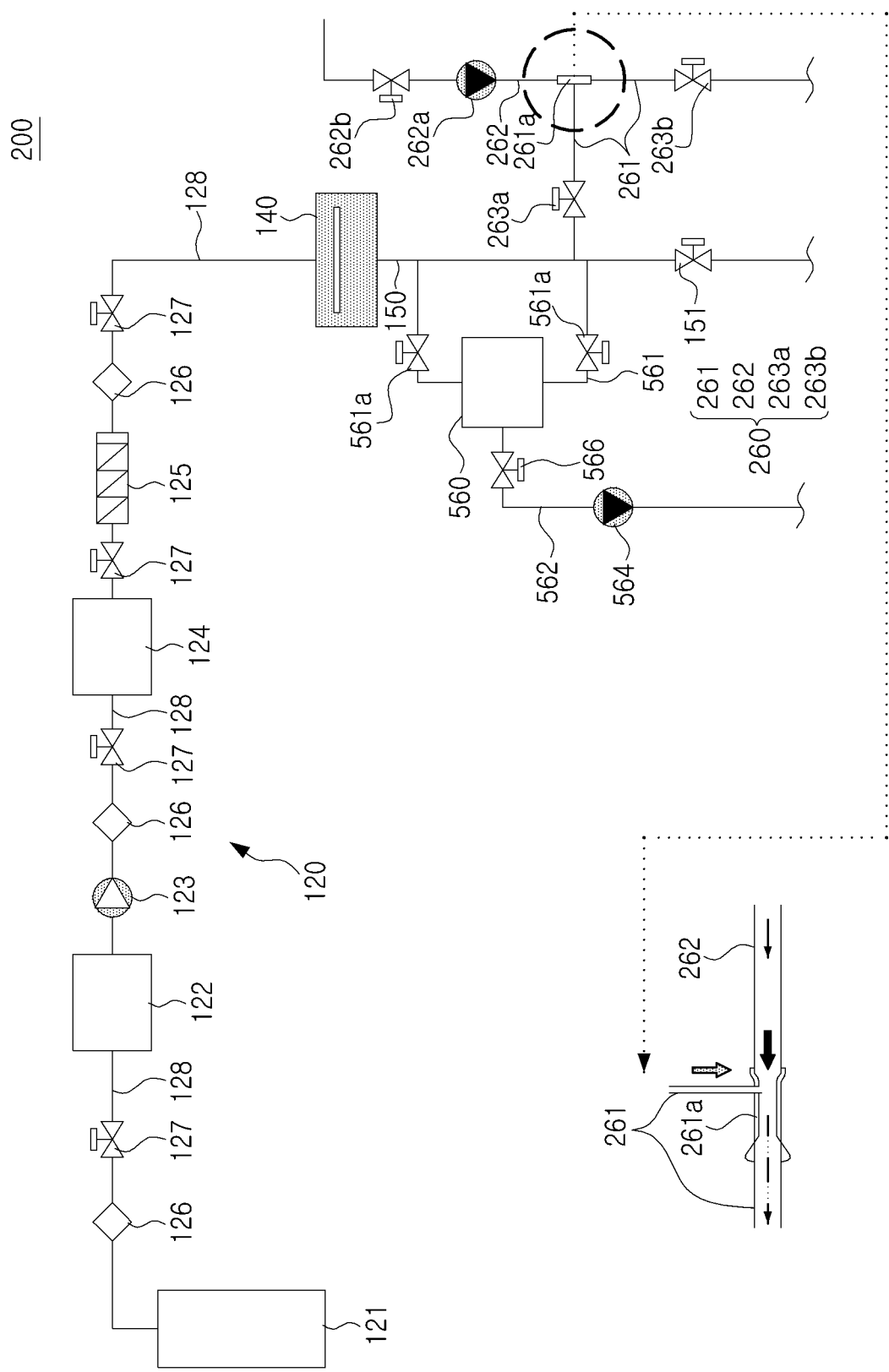
FIG. 8 is a schematic configuration diagram illustrating an apparatus for drying a wafer according to an example embodiment.

FIG. 8 is a schematic configuration diagram illustrating an apparatus for drying a wafer according to an example embodiment.

Referring to FIG. 8, an apparatus 500 for drying a wafer, as an example, includes a supercritical fluid supply module 120, a drying chamber 140, a main exhaust line 150, a main negative pressure tank 560, and an auxiliary exhaust unit 260.

Meanwhile, since the supercritical fluid supply module 120, the drying chamber 140, and the main exhaust line 150 are substantially the same as the components described in the above-described example embodiments, a detailed description thereof will be omitted below and may be understood based on the above description. In addition, since the configuration of the auxiliary exhaust unit 260 except for the main negative pressure tank 560 is substantially the same as the components described in the above-described example embodiments, a detailed description thereof will be omitted below and may be understood based on the above description.

The auxiliary exhaust unit 260 further includes a main negative pressure tank 560, and the main negative pressure tank 560 is installed in a bypass pipe 561 connected to the main exhaust line 150. In addition, a plurality of bypass valves 561a for controlling a flow of the supercritical fluid through the bypass pipe 561 may be installed in the bypass pipe 561. In addition, the main negative pressure tank 560 may have an interior space having a volume greater than that of the interior space of the drying chamber 140 for smooth exhaust of the supercritical fluid. As an example, the main negative pressure tank 560 is connected to the main exhaust line 150 to shorten an exhaust time of the supercritical fluid when the pressure of the drying chamber 140 is less than or equal to a third pressure, greater than the first pressure. Accordingly, until the pressure of the drying chamber 140 decreases to the first pressure from the third pressure, the supercritical fluid exhausted from the drying chamber 140 is exhausted externally through the main negative pressure tank 560. Thereafter, when the pressure of the drying chamber 140 is equal to or lower than the first pressure, the supercritical fluid is exhausted by the auxiliary exhaust line 261.

As described above, since the main negative pressure tank 560 is installed in the main exhaust line 150, the exhaust time of the supercritical fluid until the pressure of the drying chamber 140 decreases to the first pressure can also be reduced. Accordingly, the possibility of contamination due to re-adsorption of foreign substances can be further reduced.

Meanwhile, the main negative pressure tank 560 may include a main pipe 562 for forming negative pressure and a main pump 564 for forming negative pressure installed in the pipe 562. For example, when the pressure of the main negative pressure tank 560 becomes negative pressure, the main pump 564 for forming negative pressure is driven to discharge fluid exhausted from the main negative pressure tank 560 through the main pipe 562 for forming negative pressure with regard to ambient air. In addition, an opening/closing valve 566 may be installed in the main pipe 562 for forming negative pressure.

As described above, the supercritical fluid is exhausted through the main negative pressure tank 560 until the pressure of the drying chamber 140 becomes equal to or lower than first pressure, and when the pressure of the drying chamber 140 is equal to or lower than the first pressure, the supercritical fluid may be exhausted through the auxiliary exhaust line 261, such that the exhaust time of the supercritical fluid can be further reduced. Accordingly, it is possible to further reduce contamination due to re-adsorption of foreign substances.

Figure 9:
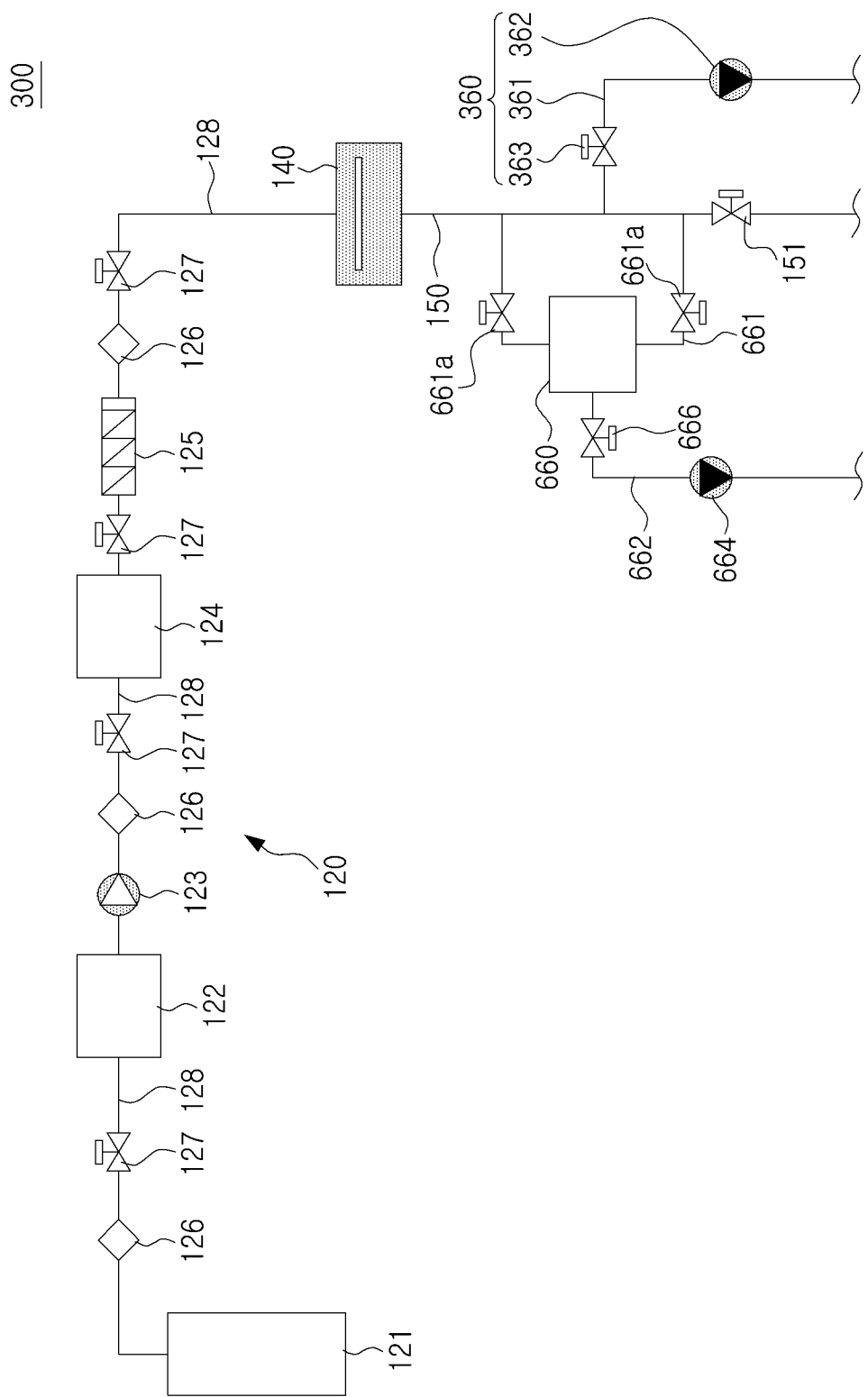
FIG. 9 is a schematic block diagram illustrating an apparatus for drying a wafer according to an example embodiment.

FIG. 9 is a schematic configuration diagram illustrating an apparatus for drying a wafer according to an example embodiment.

Referring to FIG. 9, an apparatus 600 for drying a wafer, includes, as an example a supercritical fluid supply module 120, a drying chamber 140, a main exhaust line 150, a main negative pressure tank 660, and an auxiliary exhaust unit 360.

Meanwhile, since the supercritical fluid supply module 120, the drying chamber 140, and the main exhaust line 150 are substantially the same as the components described in the above-described example embodiments, a detailed description thereof will be omitted below and may be understood based on the above description. In addition, since the configuration of the auxiliary exhaust unit 360 except for the main negative pressure tank 660 is substantially the same as the components described in the above-described example embodiments, a detailed description thereof will be omitted below and may be understood based on the above description.

The apparatus 600 for drying a wafer further include a main negative pressure tank 660, and the main negative pressure tank 660 is installed in a bypass pipe 661 connected to the main exhaust line 150. In addition, a plurality of bypass valves 661a for controlling a flow of the supercritical fluid through the bypass pipe 661 may be installed in the bypass pipe 661. In addition, the main negative pressure tank 660 may have an interior space having a volume larger than that of the interior space of the drying chamber 140 for smooth exhaust of the supercritical fluid. As an example, the main negative pressure tank 660 is connected to the main exhaust line 150 to shorten the exhaust time of the supercritical fluid when the pressure of the drying chamber 140 is equal to or lower than a third pressure, that is greater than the first pressure. Accordingly, until the pressure of the drying chamber 140 decreases from the third pressure to the first pressure, the supercritical fluid exhausted from the drying chamber 140 is exhausted externally through the main negative pressure tank 660. Thereafter, when the pressure of the drying chamber 140 becomes equal to or lower than the first pressure, the supercritical fluid is exhausted by the auxiliary exhaust line 361.

As described above, since the main negative pressure tank 660 is installed in the main exhaust line 150, the exhaust time of the supercritical fluid may be reduced before the pressure of the drying chamber 140 decreases to the first pressure can also be reduced. Accordingly, the possibility of contamination due to re-adsorption of foreign substances can be further reduced.

Meanwhile, the main negative pressure tank 660 may include a main pipe 662 for forming negative pressure and a main pump 664 for forming negative pressure installed in the main pipe 662. For example, when the pressure of the main negative pressure tank 660 becomes negative pressure, the main pump 664 for forming negative pressure is driven to discharge fluid exhausted from the main negative pressure tank 660 through the main pipe 662 for forming negative pressure to the outside air. In addition, an opening/closing valve 666 may be installed in the main pipe 662 for forming negative pressure.

As described above, the supercritical fluid is exhausted through the main negative pressure tank 660 until the pressure of the drying chamber 140 becomes equal to or less than the first pressure, and when the pressure of the drying chamber 140 is equal to or lower than the first pressure, the supercritical fluid may be exhausted through the auxiliary exhaust pump 362 of the auxiliary exhaust unit 360, such that the exhaust time of the supercritical fluid can be further reduced. Accordingly, it is possible to further reduce contamination due to re-adsorption of foreign substances.

Figure 10:
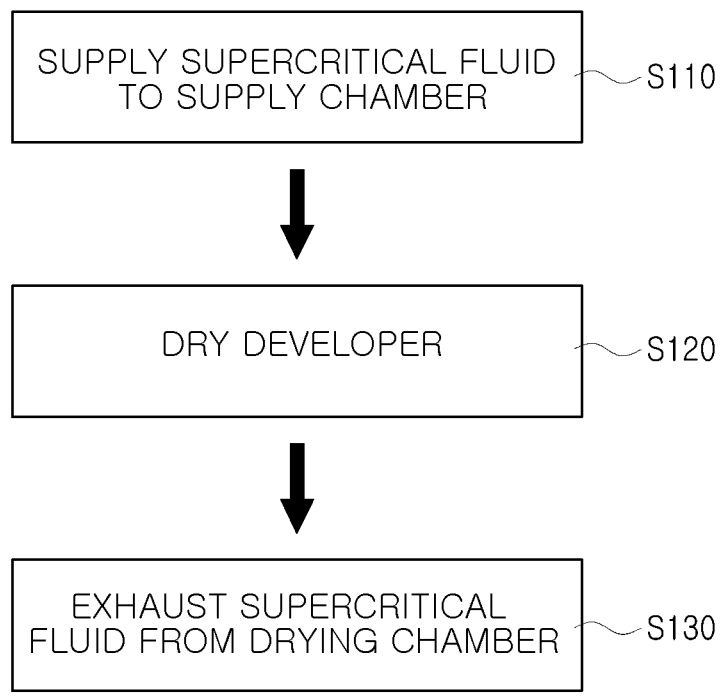
FIG. 10 is a flowchart illustrating a method for drying a wafer according to an example embodiment.
Figure 11:
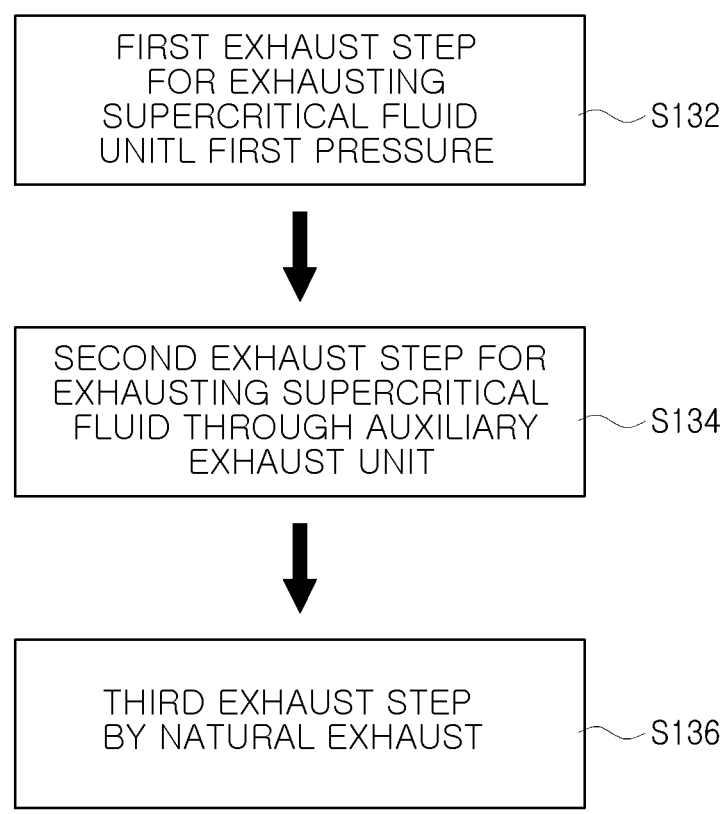
FIG. 11 is a flowchart for illustrating an exhaust step of a method for drying a wafer according to an example embodiment.
Figure 12:
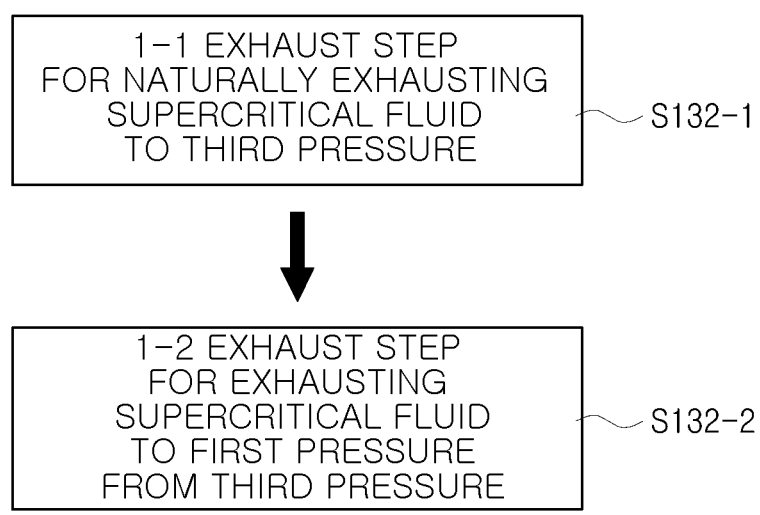
FIG. 12 is a flowchart illustrating a first exhaust step of a method for drying a wafer according to an example embodiment.

FIG. 10 is a flowchart illustrating a method for drying a wafer according to an example embodiment, FIG. 11 is a flowchart illustrating an exhaust step included in the method for drying a wafer according to an example embodiment, and FIG. 12 is a flowchart for illustrating a first exhaust step of the method for drying a wafer according to an example embodiment.

Referring to FIG. 10, supercritical fluid is supplied to a drying chamber (S110). Thereafter, a developer remaining on a wafer is dried by the supercritical fluid in a state in which the drying chamber is closed (S120). Thereafter, when the drying of the developer is completed, the supercritical fluid is exhausted from the drying chamber (S130).

Meanwhile, referring to FIG. 11, supercritical fluid is exhausted from a drying chamber until internal pressure of the drying chamber decreases to a first pressure (S132). In other words, the method for drying a wafer includes a first exhaust step for exhausting supercritical fluid from the drying chamber until the internal pressure of the drying chamber decreases to the first pressure.

As an example, as shown in FIG. 12, the first exhaust step may include a 1-1 exhaust step S132-1 in which the exhaust of the supercritical fluid from the drying chamber is performed until the internal pressure of the drying chamber decreases to a third pressure (greater than the first pressure) through natural exhaust, and a 1-2 exhaust step in which the supercritical fluid is exhausted by a pressure difference between a main negative pressure tank and the drying chamber while the internal pressure of the drying chamber is equal to or less than the third pressure and greater than the first pressure.

However, embodiments of the present disclosure are not limited thereto, and the first exhaust step may not include the 1-1 exhaust step and the 1-2 exhaust step, and the supercritical fluid may be exhausted only through natural exhaust until the internal pressure of the drying chamber decreases to the first pressure. Meanwhile, the third pressure may have a value of approximately 80 bar to 100 bar.

Thereafter, a second exhaust step of exhausting the supercritical fluid from the drying chamber through the auxiliary exhaust unit when the internal pressure of the drying chamber is equal to or lower than the first pressure may be performed (S134). Looking at this in more detail, when the pressure of the drying chamber decreases to the first pressure, a main valve installed in the main exhaust line is closed, and the first and second valves installed in the auxiliary exhaust line are opened, such that the supercritical fluid is exhausted through a negative pressure tank or orifice portion installed in the auxiliary exhaust line. Alternatively, when the pressure of the drying chamber decreases to the first pressure, the main valve installed in the main exhaust line is closed, and the first and second valves installed in the auxiliary exhaust line are opened, so that exhausting of the drying chamber is performed by an auxiliary exhaust pump of the auxiliary exhaust unit.

In this case, the supercritical fluid may be discharged from the drying chamber by a pressure difference between the internal pressure of the drying chamber and the negative pressure formed by the negative pressure tank or the orifice portion of the auxiliary exhaust unit. Alternatively, the exhaust of the supercritical fluid from the drying chamber may be accomplished by an auxiliary exhaust pump of the auxiliary exhaust unit. Accordingly, the exhaust time of the supercritical fluid may be shortened by exhausting the supercritical fluid from the drying chamber through the auxiliary exhaust unit compared to the case of exhausting the supercritical fluid by natural exhaust through the difference in pressure between atmospheric pressure and the drying chamber.

Meanwhile, looking at this in more detail, as shown in FIG. 2, it can be seen that when the supercritical fluid is continuously exhausted through the main exhaust line when the pressure of the drying chamber is equal to or lower than a first pressure P1, the exhaust time takes approximately 60 s. However, it can be seen that when the supercritical fluid is exhausted through the auxiliary exhaust line of the auxiliary exhaust line, the exhaust time takes approximately 15 s. In other words, it can be seen that when the supercritical fluid is exhausted from the drying chamber using the difference in pressure between the negative pressure tank of the auxiliary exhaust unit and the drying chamber, the exhaust time is reduced.

That is, as shown in FIG. 2, it can be seen that a ratio (slope) of a pressure reduction amount of the drying chamber 140 to the exhaust time of the supercritical fluid, when the supercritical fluid is continuously exhausted through the main exhaust line when the pressure of the drying chamber is equal to or lower than a first pressure, has an absolute value smaller than an absolute value of a ratio (slope) of a pressure reduction amount of the drying chamber 140 to the exhaust time of the supercritical fluid when the supercritical fluid is exhausted through the auxiliary exhaust line of the auxiliary exhaust unit, when the pressure of the drying chamber is equal to or lower than a first pressure P1.

However, when the pressure of the drying chamber is equal to or lower than the first pressure, the ratio (slope) of the pressure reduction amount of the drying chamber to the exhaust time of the supercritical fluid is not limited to the example embodiment of FIG. 2.

For example, when the first pressure P1 is 80 bar, when a section in which the pressure of the drying chamber is from 80 bar to 20 bar is referred to as a first section, and a section in which the pressure of the drying chamber is 20 bar or less, is referred to as a second section, the ratio (slope) of the pressure reduction amount of the drying chamber to the exhaust time of the supercritical fluid at the first section may have an absolute value within a range of 0.75 to 9.0 bar/sec, and the ratio (slope) of the pressure reduction amount of the drying chamber to the exhaust time of the supercritical fluid at the second section may have an absolute value within a range of 0.95 to 2 bar/sec. Accordingly, the ratio (slope) of the pressure reduction amount of the drying chamber to the exhaust time of the supercritical fluid at the first pressure P1 or less may have an absolute value within a range of 0.75 to 9.0 bar/sec.

In addition, when the pressure of the drying chamber 140 is equal to or lower than the first pressure P1, the exhaust time of the supercritical fluid may have a value within a range of 10 s to 50 s.

Thereafter, when the internal pressure of the drying chamber is equal to or lower than a second pressure, a third exhaust step of exhausting supercritical fluid from the drying chamber by natural exhaust may be performed (S136). Accordingly, it is possible to prevent negative pressure from being formed in the drying chamber. Therefore, it is possible to prevent foreign substances from being re-introduced into the drying chamber and re-adsorbed to the drying chamber or the wafer.

As set forth above, according to embodiments of the present disclosure, it is possible to provide an apparatus for drying a wafer and a method for drying a wafer capable of shortening an exhaust time of supercritical fluid.

In addition, it is possible to provide an apparatus for drying a wafer and a method for drying a wafer capable of preventing contamination of the wafer and the drying chamber by impurities.

According to embodiments, the apparatuses of the present disclosure may further include a controller that is configured to control any number of other components (e.g. valves, condensers, pumps, heaters, and/or drying chambers) of the present disclosure to perform their respective functions. For example, the controller may be configured to control other components of the apparatuses of the present disclosure to perform the methods described with respect to FIGS. 10-12, and/or other methods of the present disclosure. According to embodiments, the apparatuses of the present disclosure may further include sensors (e.g. pressure sensors) for detecting pressure(s) in the apparatuses, and the controller may be configured to obtain pressure value(s) from the sensors and control the other components (e.g. valves) of the apparatuses, in accordance with methods of the present disclosure, by making determinations based on the obtain pressure value(s) in relation to the first, second, and/or third pressure.

According to embodiments, the controller may comprise at least one processor and memory storing computer instructions. The computer instructions, when executed by the at least one processor, may cause the controller to perform its functions.

The various advantages and effects of embodiments of the present disclosure are not limited to the above description, and can be more easily understood in the course of describing a specific example embodiment of the present disclosure.

While non-limiting example embodiments have been illustrated and described above, it will be apparent to those skilled in the art that modifications and variations could be made without departing from the scope of the disclosure.

What is claimed is:

1. An apparatus for drying a wafer, comprising:
    a drying chamber having an interior space;
    a supercritical fluid supply module connected to the drying chamber and configured to supply supercritical fluid to the drying chamber;
    a main exhaust line connected to the drying chamber and in which a main valve is installed; and
    an auxiliary exhaust unit connected to the main exhaust line,
    wherein the supercritical fluid supply module comprises:
        a fluid storage tank;
        a condenser connected to the fluid storage tank and configured to pressurize fluid;
        a pump disposed at a rear end of the condenser;
        a reservoir tank disposed at a rear end of the pump and configured to store the fluid pressurized by the condenser; and
        a heater disposed at a rear end of the reservoir tank and configured to heat the fluid,
    wherein the auxiliary exhaust unit comprises:
        an auxiliary exhaust line connected to the main exhaust line and configured to exhaust the supercritical fluid from the drying chamber when the main valve is closed;
        a negative pressure tank installed in the auxiliary exhaust line;
        a first valve, installed in the auxiliary exhaust line, that is disposed at a front end of the negative pressure tank and configured to be opened when the main valve is closed; and
        a second valve, installed in the auxiliary exhaust line, that is disposed at a rear end of the negative pressure tank and configured to be opened in conjunction with the first valve,
    wherein a ratio of a pressure reduction amount in the drying chamber to an exhaust time of the supercritical fluid through the auxiliary exhaust unit, when internal pressure of the drying chamber is equal to or lower than a first pressure, has an absolute value within a range of 0.75 to 9.0 bar/sec.

2. The apparatus for forming a wafer of claim 1, wherein the auxiliary exhaust unit further comprises:
    a pipe for forming negative pressure connected to the negative pressure tank; and
    a pump, provided with the pipe, and configured to form the negative pressure of the negative pressure tank.

3. The apparatus for drying a wafer of claim 2, wherein an opening/closing valve, that is configured to open and close the pipe, is provided with the pipe.

4. The apparatus for drying a wafer of claim 1, wherein the apparatus further comprises a controller,
    wherein the controller is configured to, based on the internal pressure of the drying chamber being greater than the first pressure, control the main valve to be opened, and the first valve and the second valve to be closed so that the supercritical fluid is exhausted through the main exhaust line, and
    wherein the controller is further configured to, based on the internal pressure of the drying chamber being equal to or lower than the first pressure, control the main valve to be closed, and the first valve and the second valve to be opened so that the supercritical fluid is exhausted through the auxiliary exhaust line.

5. The apparatus for drying a wafer of claim 1, wherein the supercritical fluid is supercritical $CO_2$.

6. The apparatus for drying a wafer of claim 5, wherein the apparatus is configured to have pressure of the supercritical fluid to be 73 bar or more at a time when the supercritical fluid is exhausted from the drying chamber, and
    wherein the apparatus is configured to have a temperature of the supercritical fluid to be 33.1° C. or higher at the time when the supercritical fluid is exhausted from the drying chamber.

7. The apparatus for drying a wafer of claim 5, wherein the first pressure has a value within a range of 20 bar to 80 bar.

8. The apparatus for drying a wafer of claim 1, further comprising a main negative pressure tank connected to a bypass pipe connected to the main exhaust line.

9. The apparatus for drying a wafer of claim 8, wherein the main negative pressure tank has an interior space having a volume greater than a volume of the interior space of the drying chamber.

10. The apparatus for drying a wafer of claim 1, wherein the exhaust time of the supercritical fluid through the auxiliary exhaust unit, when the internal pressure of the drying chamber is equal to or lower than the first pressure, has a value in a range 10 s to 50 s.

11. The apparatus for drying a wafer of claim 1, wherein the supercritical fluid supply module further comprises at least one filter disposed at a rear end of the fluid storage tank and at least one valve disposed adjacent to the condenser, the reservoir tank, and the heater.

\* \* \* \* \*